(12) United States Patent
Asplund

(10) Patent No.: US 8,716,893 B2  
(45) Date of Patent: May 6, 2014

(54) VOLTAGE IN A VOLTAGE SOURCE CONVERTER, A VOLTAGE SOURCE CONVERTER AND A METHOD FOR CONTROL THEREOF

(75) Inventor: Gunnar Asplund, Solna (SE)

(73) Assignee: ABB Technology AG, Zurich (CH)

( * ) Notice: Subject to any disclaimer, the term of this patent is extended or adjusted under 35 U.S.C. 154(b) by 778 days.

(21) Appl. No.: 12/863,619

(22) PCT Filed: Jan. 21, 2008

(86) PCT No.: PCT/EP2008/050612  
§ 371 (c)(1),  
(2), (4) Date: Sep. 1, 2010

(87) PCT Pub. No.: WO2009/092435  
PCT Pub. Date: Jul. 30, 2009

(65) Prior Publication Data  
US 2011/0260545 A1    Oct. 27, 2011

(51) Int. Cl.  
*H02J 1/10*    (2006.01)

(52) U.S. Cl.  
USPC ............ 307/75; 307/28; 307/36; 307/37; 307/6; 307/4; 363/70; 327/427

(58) Field of Classification Search  
CPC .......... G06F 1/26; H02J 1/10; H02J 1/008; H03K 17/063; H03K 17/0822; H03K 17/04123  
USPC ......... 327/427, 430, 431, 434–436, 470, 473, 327/505, 440; 435/436; 361/92.1, 91.5; 363/37, 132, 98, 20; 307/125, 140; 323/300  
See application file for complete search history.

(56) References Cited

U.S. PATENT DOCUMENTS

| | | | |
|---|---|---|---|
| 5,793,623 A | * | 8/1998 | Kawashima et al. ...... 363/56.05 |
| 6,278,314 B1 | * | 8/2001 | Asplund et al. ................ 327/427 |
| 6,351,399 B2 | * | 2/2002 | Takanashi et al. .......... 363/56.05 |

FOREIGN PATENT DOCUMENTS

| | | |
|---|---|---|
| EP | 0 502 715 A1 | 9/1992 |
| EP | 0 620 645 A2 | 10/1994 |
| JP | 4-157918 A | 5/1992 |
| WO | WO 00/13282 A1 | 3/2000 |

* cited by examiner

*Primary Examiner* — Jared Fureman  
*Assistant Examiner* — Jagdeep Dhillon  
(74) *Attorney, Agent, or Firm* — Birch, Stewart, Kolasch & Birch, LLP

(57) ABSTRACT

A VSC converter includes in each valve one first semiconductor device of turn-off type with a voltage blocking capacity rating of a first, high level and connected in parallel therewith a series connection of a plurality of second semiconductor devices of turn-off type with a voltage blocking capacity rating of a second, lower level. A control arrangement of the converter is configured to switch a said valve into a conducting state starting from a forward biased blocking state of the valve by controlling the second semiconductor devices to be turned on and then the first semiconductor devices to be turned on with a delay, and at the end of the conducting state to turn off the first semiconductor device in advance of turning the second semiconductor devices off.

22 Claims, 2 Drawing Sheets

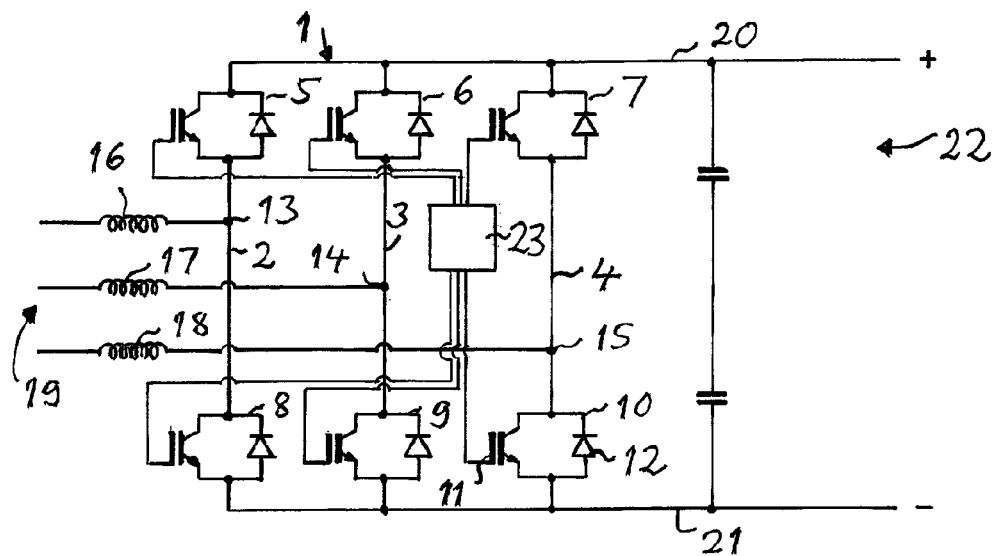
Fig 1
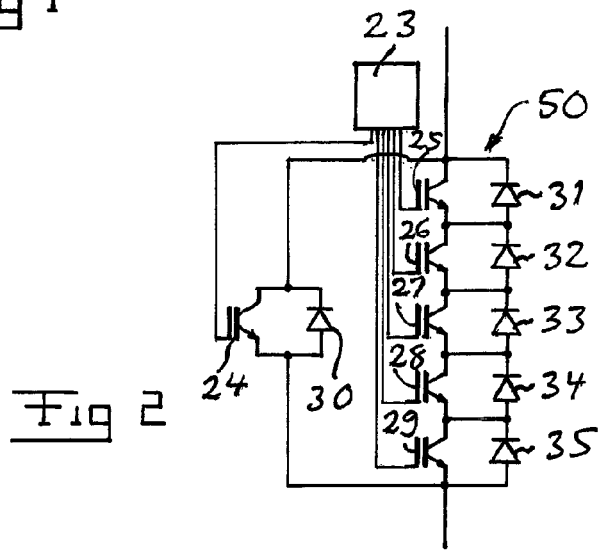
Fig 2
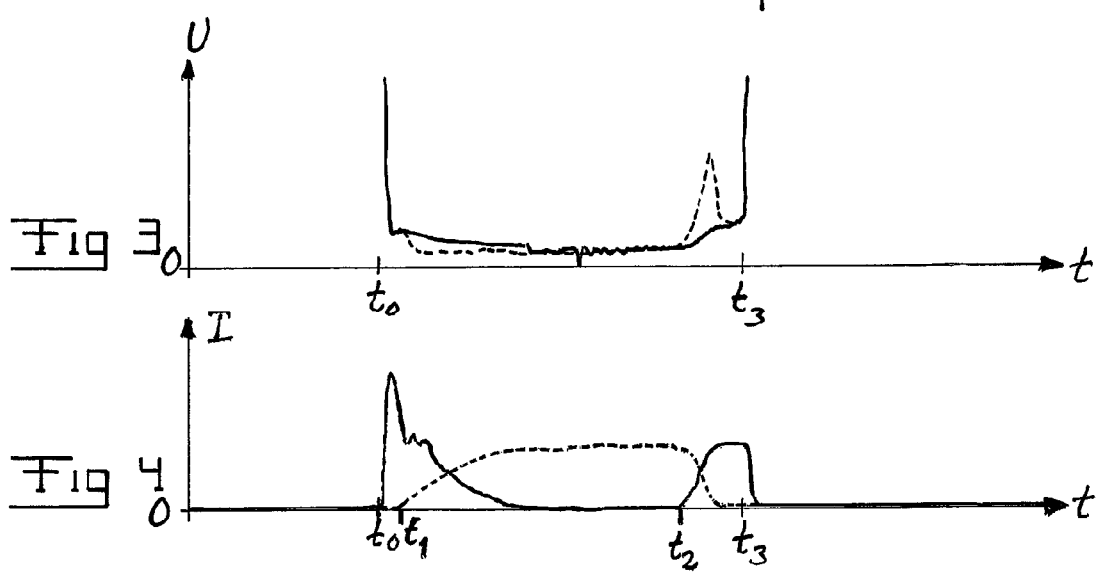
Fig 3
Fig 4

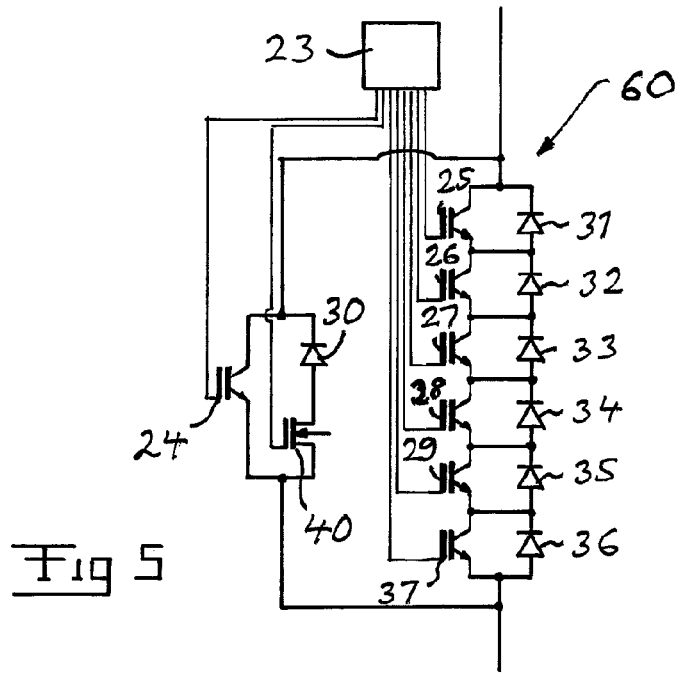
Fig 5
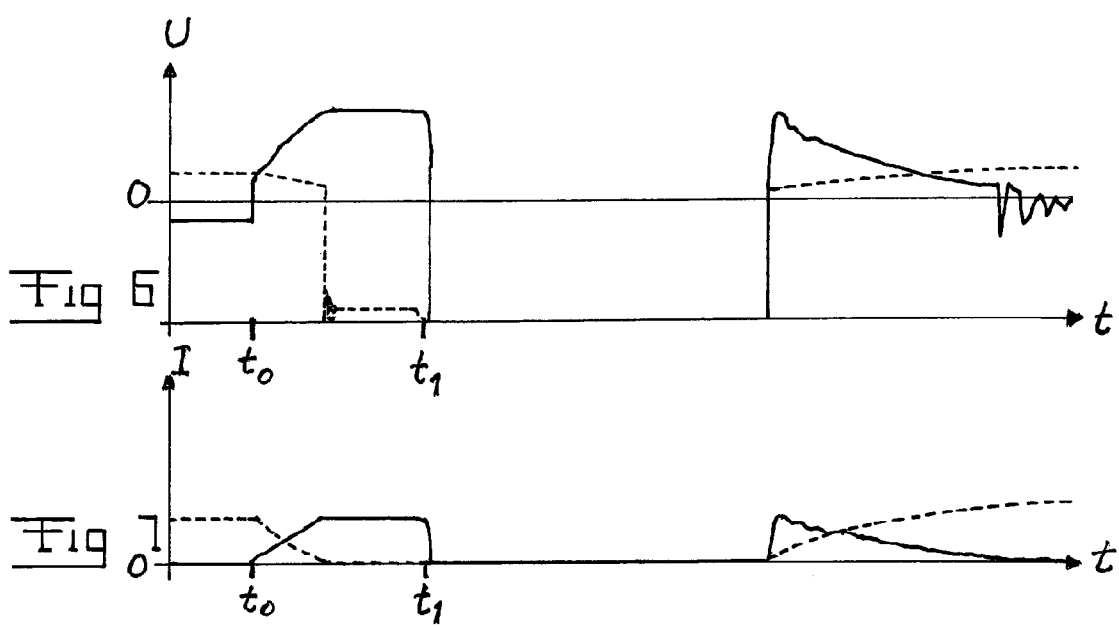
Fig 6
Fig 7

VOLTAGE IN A VOLTAGE SOURCE CONVERTER, A VOLTAGE SOURCE CONVERTER AND A METHOD FOR CONTROL THEREOF

The present invention relates to a Voltage Source Converter (VSC) for converting direct voltage into alternating voltage and conversely and which has at least one phase leg configured to be connected to opposite poles on a direct voltage side of the converter and comprising a series connection of at least two current valves, said valves comprising at least one semiconductor device of turn-off type and one rectifying member connected in anti-parallel therewith, a mid point of said series connection of valves forming a phase output being configured to be connected to an alternating voltage side of the converter, the converter further comprising an arrangement configured to control said semiconductor devices of said valves to generate a train of pulses with determined amplitudes according to a Pulse Width Modulation (PWM) pattern on said phase output, as well as a method for controlling a Voltage Source Converter (VSC) according to the preamble of the appended independent method claim.

The converter to be controlled may have any number of said phase legs, but it has normally three such phase legs for having a three phase alternating voltage on the alternating voltage side thereof.

A Voltage Source Converter of this type may be used in all kinds of situations, in which direct voltage is to be converted into alternating voltage or conversely, in which examples of such uses are in stations of HVDC-plants (High Voltage Direct Current), in which direct voltage is normally converted into a three-phase alternating voltage or conversely, or in so-called back-to-back-stations in which alternating voltage is firstly converted into direct voltage and this is then converted into alternating voltage, as well as in SVCs (Static Var Compensator), in which the direct voltage side consists of one or more capacitors hanging freely. However, the present invention is not restricted to these applications, but other applications are also conceivable, such as in different types of drive systems for machines, vehicles etc.

Such a Voltage Source Converter may have more than two current valves per phase leg and then deliver pulses of more than two different amplitudes or levels on said phase output, such as in a NPC-type converter (Neutral Point Clamped). Each such valve may also have a plurality of said power semiconductor devices of turn-off type connected in series for being able to together block the voltage to be blocked in the blocking state of the valve. IGBTs (Insulated Gate Bipolar Transistor) are normally used in such converters as semiconductor devices of turn-off type, but any such semiconductor device, such as IGCTs (Integrated Gate Commutated Thyristor) is within the scope of the present invention.

A two level converter of this type is very schematically shown in appended FIG. 1 for illuminating the present invention but not in any way restrict it thereto. This VSC converter 1 has three phase legs 2, 3, 4 with two current valves 5-10 each, each consisting of at least one semiconductor device of turn-off type, such as an IGBT 11, and a rectifying member in the form of a diode 12 connected in anti-parallel therewith. A mid point of each phase leg forms a phase output 13, 14, 15 for connection through phase reactors 16, 17, 18 to a three-phase alternating voltage network 19. Opposite ends of each phase leg is connected to opposite poles 20, 21 on a direct voltage side of the converter, such as a positive and negative pole conductor of a direct voltage network 22.

The converter has an arrangement 23 configured to control the semiconductor devices 11 of the valves to generate a train of pulses with determined amplitudes according to a Pulse Width Modulation (PWM) pattern on the respective phase output for creating an alternating voltage on the respective line of the alternating voltage network 19. When for example the semiconductor device of the valve 7 is turned on a positive pulse will result on the phase output 15, and if instead the semiconductor device of the valve 10 is turned on a negative pulse with the same amplitude will result on the phase output 15. During the positive half cycle of the alternating voltage to be generated on the phase output 15 the semiconductor device of the valve 7 will alternatively be turned on and off for generating a train of positive pulses, and during the negative half cycle of said alternating voltage the semiconductor device of the valve 10 will be alternatively turned on and off. The pulse number, i.e. the number of pulses resulting from this Pulse Width Modulation during a period of an alternating voltage obtained by this control, may typically be as high as 15-25 for obtaining an attractive shape of the curve on the alternating voltage side while keeping costs of filtering equipment at an acceptable level.

Not neglectible losses are created in the semiconductor devices of the valves. These losses are of two types, namely conduction losses resulting in the conducting state of the semiconductor device and switching losses resulting when the semiconductor device is turned on or turned off. The problem of high switching losses is of course the more important the higher the switching frequency, i.e. said pulse number. Semiconductor devices with a voltage blocking capacity rating of a low level have considerably lower switching losses than such semiconductor devices with such a rating of a higher level, so that a higher number of such semiconductor devices with a voltage blocking capacity rating of a lower level may be connected in series instead of one or few such semiconductor devices with a rating of a higher level for by that considerably reducing the switching losses of the valve in question. However, this will then result in higher conduction losses of the valve, since a semiconductor device having a voltage blocking capacity rating of a higher level will have considerably lower conduction losses. It may be mentioned as an example that for a pulse number of 23 the switching losses of five 1200 V IGBTs connected in series would be 1300 u compared to 12000 u for a 6500 V IGBT, whereas the conduction losses would for said series connection be 8000 u and for said single 6500 V IGBT 3200 u. Accordingly, there is for each application intended for such a VSC converter a trade off between conduction losses and switching losses when determining the number of such semiconductor devices of turn-off type to be connected in series in each said valve of the converter.

SUMMARY OF THE INVENTION

The object of the present invention is to provide a converter of the type defined in the introduction addressing the problems mentioned above with respect to losses created in the valves of the converter for making it possible to reduce the total losses created in such valves with respect to such converters already known.

This object is according to the invention obtained by providing a converter of the type defined in the introduction, which is characterized in that each said valve comprises one first semiconductor device of turn-off type with a voltage blocking capacity rating of a first, high level and connected in parallel therewith a series connection of a plurality of second semiconductor devices of turn-off type with a voltage blocking capacity rating of a second, lower level, and that said control arrangement is configured to switch a said valve into a conducting state starting from a forward biased blocking state of the valve by controlling said second semiconductor devices to be turned on and then said first semiconductor device to be turned on with a delay sufficient for the voltage across said valve to fall to a fraction of less than 10% of the voltage across the valve in said forward biased blocking state of the valve and at the end of the conducting state to turn off said first semiconductor device sufficiently in advance of turning said second semiconductor devices off for enabling a majority of recombinations of charge carriers in said first semiconductor device to take place before said turning off of the second semiconductor devices.

Accordingly, said first semiconductor device with a voltage blocking capacity rating of a high level will be turned on and turned off when the voltage across the valve is low, so that the switching losses will be determined by the configuration of said second semiconductor devices having a voltage blocking capacity rating of a lower level, whereas the current will during the conducting state of the valve flow through said first semiconductor device, which will then determine the conduction losses of the valve. This means that the low conduction losses of a semiconductor device with a voltage blocking capacity rating of a high level may be combined with the low switching losses of semiconductor devices with a voltage blocking capacity rating of a lower level, so that the losses of the valve may be reduced considerably without sacrificing the good performance of the converter.

According to an embodiment of the invention the number of said second semiconductor devices connected in series and in parallel with one said first semiconductor device are ≥3, 3-10 or 4-7. These are suitable numbers of such second semiconductor devices per first semiconductor device, but it is pointed out that the number of first semiconductor devices may of course be comparatively high, such as 20, in which case the number of second semiconductor devices in the valve may well be about 100. The relationship of said first high level/said second low level is then approximately equal to the number of second semiconductor devices connected in parallel with said first semiconductor device for fully utilize the properties of each such semiconductor device, also with respect to the costs thereof.

According to another embodiment of the invention said control arrangement is configured to control said valves to deliver a said Pulse Width Modulation pattern with a pulse number p≥10, 13-40 or 15-25, in which the pulse number is defined as the number of pulses resulting from said Pulse Width Modulation pattern during a period of an alternating voltage obtained by said control on said phase output. The invention is particularly interesting when the pulse number p is comparatively high, so that the switching losses of a semiconductor device with a voltage blocking capacity rating of a high level will be considerable with respect to the conduction losses of such a semiconductor device.

According to another embodiment of the invention said delay is less than 10% of an average duration of a conducting state of said valve, which means that the current may be converted to flow through said first semiconductor device during the major part of said conducting state. This delay will for a specific converter be a fixed delay, which typically may be in the order of μs.

According to another embodiment of the invention said turning-off in advance is controlled to take place at a time being sufficient for reducing the current through said first semiconductor device to be less than 10% of the current therethrough in the conducting state of said valve, which means that the valve may be transferred to the forward biased blocking state when substantially all the current flows through said second semiconductor devices, which will then determine the switching losses created. The control arrangement is preferably configured to control said second semiconductor device of the valve to turn on and turn off when a saw tooth voltage used for said PWM crosses a reference alternating voltage, and to control the first semiconductor device at times being with a certain delay or prior to the control of the second semiconductor devices.

According to other embodiments of the invention said first and second semiconductor devices are IGBTs (Insulated Gate Bipolar Transistor) and IGCTs (Integrated Gate Commutated Thyristor), respectively.

According to another embodiment of the invention said first semiconductor device has a said first, high level≥3 kV, ≥5 kV, ≥10 kV or 5 kV-30 kV. These are suitable levels for the voltage blocking capacity rating of said first semiconductor device, in which the corresponding level will for the second semiconductor devices typically be ⅓-⅐ thereof.

According to another embodiment of the invention each said valve comprises a series connection of a plurality of units having on one hand one first semiconductor device and on the other a series connection of second semiconductor devices connected in parallel therewith, and said control arrangement is configured to control all said first semiconductor devices of the valve substantially simultaneously and all second semiconductor devices of the valve substantially simultaneously.

According to another embodiment of the invention said number of first semiconductor devices in said valve adapted to be controlled simultaneously ≥3, ≥5, ≥10, ≥20, 20-130 or 40-80. The higher numbers are typically to be used for the application of a converter according to the invention in HVDC-plants in which voltages to be handled may well be in the order of 400 kV-800 kV.

According to another embodiment of the invention said control arrangement is configured to control said valves to generate an alternating voltage on said phase output having a frequency of 40 Hz-70 Hz, 50 Hz or 60 Hz. These are suitable frequencies for an alternating voltage to be generated on said phase output of the converter.

According to another embodiment of the invention said valve has a first rectifying member with a voltage blocking capacity rating of a third, high level connected in anti-parallel with said first semiconductor device and a plurality of second rectifying members with a voltage blocking capacity rating of a fourth, lower level connected in series and in anti-parallel with said series connection of second semiconductor devices, which is suitable for a good function of each said valve and the converter, and according to a further development of this embodiment said valve comprises a third semiconductor device of turn-off type connected in series with said first rectifying member and in parallel with said first semiconductor device, and said control arrangement is configured, when said valve is in a state in which the current flows through the rectifying members thereof, to control said third semiconductor device to turn off prior to a main commutation of the current to flow through a valve on the other side of said mid point than said valve for having the current commutated into the second rectifying members before such a main commutation. This means that the losses created in said valve may be reduced even more, since said first rectifying member will have a lower on-state voltage than the on-state voltage of the series connection of said second rectifying members, so that the current will go through the first rectifying member when it flows through the rectifying members of such a valve, but this means that would then a said main commutation take place comparatively high losses would result in this first rectifying member. By commutating the current into the second rectifying members before a said main commutation of the current to flow through the valve on the other side of said mid point the losses will be determined by the properties of said second rectifying members and by that be considerably lower.

According to another embodiment of the invention said third semiconductor device is a MOS transistor. This is advantageous, since such a transistor can have an on-state voltage being neglectible at rated current with respect to the forward voltage drop of a said first rectifying member with a voltage blocking capacity rating of a high level, so that this third semiconductor device will only contribute marginally to the on-state losses of the converter.

According to another embodiment of the invention the number of said second rectifying members is the same as the number of said second semiconductor devices, and one said second rectifying member is connected in anti-parallel with each said semiconductor device. Said rectifying members are preferably rectifying diodes.

According to another embodiment of the invention the converter is configured to have said direct voltage side connected to a direct voltage network for transmitting High Voltage Direct Current (HVDC) and the alternating voltage side connected to an alternating voltage phase line belonging to an alternating voltage network.

According to a further embodiment of the invention said converter is a part of a SVC (Static Var Compensator) with the direct voltage side formed by capacitors hanging freely and the alternating voltage phase output connected to an alternating voltage network.

According to another embodiment of the invention the converter is configured to have a direct voltage across said two poles being 1 kV-1200 kV, 10 kV-1200 kV or 100 kV-1200 kV.

The invention also relates to a method for controlling a Voltage Source Converter according to the appended independent method claim. The advantages and advantageous features of this method and embodiments thereof defined in the appended dependent method claims appear clearly from the discussion above of the converter according to the present invention.

The invention also relates to a plant for transmitting electric power according to the appended claim therefor.

The invention further relates to a computer program and a computer readable medium according to the corresponding appended claims. It is easily understood that the method according to the invention defined in the appended set of method claims is well suited to be carried out through program instructions from a processor which may be influenced by a computer program provided with the program steps in question.

Further advantages as well as advantageous features of the invention will appear from the following description.

BRIEF DESCRIPTION OF THE DRAWINGS

With reference to the appended drawings, below follows a description of embodiments of the invention cited as examples.

In the drawings:

FIG. 1 is a schematic diagram illustrating the general structure of a known VSC converter to which the present invention is applicable, FIG. 2 is a schematic view of a valve of a Voltage Source Converter according to a first embodiment of the present invention, FIG. 3 and FIG. 4 are graphs of voltages and currents, respectively, versus time for the semiconductor devices of turn-off type in FIG. 2 when switching that valve in the forward biased state of that valve, FIG. 5 is a view corresponding to FIG. 2 of a valve in a converter according to a second embodiment of the invention, and FIGS. 6 and 7 are graphs of voltages and currents, respectively, versus time for the rectifying members of the valve according to FIG. 5 when the current flow direction through this valve is through the rectifying members.

DETAILED DESCRIPTION OF EMBODIMENTS OF THE INVENTION

FIG. 2 shows very schematically a valve in a Voltage Source Converter according to the present invention, in which the converter may be a two level converter of the type shown in FIG. 1 or any other type of known Voltage Source Converter. This valve has one first semiconductor device 24 of turn-off type with a voltage blocking capacity rating of a first, high level, in the present case 6.5 kV, and connected in parallel therewith a series connection of five second semiconductor devices 25-29 of turn-off type with a voltage blocking capacity rating of a second, lower level, in this case 1.2 kV. The first semiconductor device and the second semiconductor devices are in this case IGBTs. A rectifying diode 30 with a voltage blocking capacity rating of a third, high level, such as in the order of that of the IGBT 24, is connected in anti-parallel with the IGBT 24, and a plurality of second rectifying diodes 31-35 with a voltage blocking capacity rating of a fourth, lower level, such as in the order of that of the IGBTs 25-29, are connected in series and in anti-parallel with the series connection of the second IGBTs 25-29.

The control arrangement 23 is configured to switch such a valve into a conducting state starting from a forward biased blocking state of the valve by controlling the second semiconductor devices 25-29 to be turned on and then said first semiconductor device 24 to be turned on with a delay sufficient for the voltage across the valve to fall to a fraction of less than 10% of the voltage across the valve in said forward biased blocking state. This control arrangement is also configured to at the end of the conducting state turn off the first semiconductor device 24 sufficiently in advance of turning the second semiconductor devices 25-29 off for enabling a majority of recombinations of charge carriers in the first semiconductor device 24 to take place before the turning-off of the second semiconductor devices 25-29. This means that the high voltage IGBT 24 will be turned on at a low voltage thereacross and turned off before the voltage thereacross rises to a high level, so that the switching losses of the semiconductor devices of turn-off type of the valve will be determined by the switching losses in the second semiconductor devices 25-29, whereas the conduction losses of the semiconductor devices of turn-off type will be primarily determined by the conduction losses of the high voltage IGBT 24. For the case discussed in the introduction this means total losses in the unit 50 shown in FIG. 2 of 4500 u compared to 9300 u and 15200 u when only using the 1.2 kV IGBTs and the 6.5 kV IGBT, respectively.

Simulations of the voltages and currents in the valve shown in FIG. 2 have been carried out, and the result thereof is shown in FIG. 3 and FIG. 4. FIG. 3 shows the voltage across the high voltage IGBT 24 (dashed line) and across the low voltage IGBTs 25-29 (solid line) versus time t, and FIG. 4 shows the current through the high voltage IGBT 24 (dashed line) and the current through the low voltage IGBTs 25-29 (solid line)

versus time. The low voltage IGBTs 25-29 are turned on at the time $t_0$ and the high voltage IGBT 24 at the time $t_1$, when the voltage thereacross is low. The high voltage IGBT having a lower on-state voltage will then take over the current through the valve until the point of time $t_2$, at which the IGBT 24 is turned off and the current commutated into the low voltage IGBTs 25-29, which are then turned off at the time $t_3$.

FIG. 5 shows schematically a valve of a converter according to another embodiment of the invention, in which the same reference numerals as used in FIG. 2 have been used in this Figure for corresponding members. This embodiment differs from the previous one by the fact that a third semiconductor device 40 of turn-off type is connected in series with the rectifying member 30 and in parallel with the first semiconductor device 24. This third semiconductor device is in the present case a MOS transistor having a low on-state voltage being approximately 0.1 V, which shall be compared with the forward voltage drop of the diode 30, which is about 3.5 V.

Furthermore, the number of second semiconductor devices and second rectifying diodes is in this case six, which is indicated by the reference numerals 36 and 37.

The control arrangement 23 is configured, when the valve is in a state in which the current flows through the rectifying diodes thereof, which will be through the first rectifying diode 30, to control the MOS transistor 40 to turn off prior to a main commutation of the current to flow through a valve (the IGBTs thereof) on the other side of said mid point than said valve for having the current commutated into the second rectifying diodes 31-36 before such a main commutation. The voltage needed for commutating the current to flow through the diodes 31-36 instead of through the diode 30 will be approximately 20 V. Said main commutation will then take place at current flow through the low voltage diodes 31-36 and not through the high voltage diode 30 substantially reducing losses created by said commutation.

Results of simulations carried out for a valve according to FIG. 5 are shown in FIG. 6 and FIG. 7, in which FIG. 6 shows the voltage across the high voltage diode 30 (dashed line) and the voltage across the low voltage diodes 31-36 (solid line) versus time t, whereas FIG. 7 shows the current through the high voltage diode 30 (dashed line) and the current through the low voltage diodes 31-36 (solid line) versus time t. It is shown how the MOS transistor 40 is turned on at the time $t_0$ and the current is then transferred to flow through the diodes 31-36, whereupon said main commutation is carried out at $t_1$.

The invention is of course not in any way restricted to the embodiments described above, but many possibilities to modifications thereof will be apparent to a person with ordinary skill in the art without departing from the basic idea of the invention as defined in the appended claims.

A current valve of the converter according to the invention may of course be constituted by a number of units 50, 60 shown in FIG. 2 or FIG. 5 connected in series, and all first semiconductor devices thereof are then intended to be controlled simultaneously, whereas all second semiconductor devices are intended to be controlled simultaneously.

The invention claimed is:

1. An arrangement comprising:
a valve in a Voltage Source Converter (VSC); and
a control arrangement,
wherein said valve comprises one first semiconductor device of turn-off type with a voltage blocking capacity rating of a first, high level and series-connected second semiconductor devices of turn-off type with a voltage blocking capacity rating of a second, lower level, the first semiconductor device is connected in parallel with the series-connected second semiconductor devices, and said control arrangement is configured to switch said valve into a conducting state starting from a forward biased blocking state of the valve by controlling said second semiconductor devices to be turned on and then said first semiconductor device to be turned on with a delay sufficient for the voltage across said valve to fall to a fraction of less than 10% of the voltage across the valve in said forward biased blocking state of the valve and at the end of the conducting state to turn off said first semiconductor device in advance of turning said second semiconductor devices off, where said second semiconductor devices are turned off by said control arrangement after a majority of recombinations of charge carriers in said first semiconductor device has taken place.

2. The arrangement according to claim 1, wherein the number of said second semiconductor devices connected in series and in parallel with said first semiconductor device are ≥3, 3-10 or 4-7.

3. The arrangement according to claim 1, wherein the relationship of said first high level/said second lower level is approximately equal to the number of second semiconductor devices connected in parallel with said first semiconductor device.

4. The arrangement according to claim 1, wherein said delay is less than 10% of an average duration of a conducting state of said valve.

5. The arrangement according to claim 1, wherein said turning off in advance is controlled to take place at a time being sufficient for reducing the current through said first semiconductor device to be less than 10% of the current therethrough in the conducting state of said valve.

6. The arrangement according to claim 1, wherein said first and second semiconductor devices are IGBTs (Insulated Gate Bipolar Transistor).

7. The arrangement according to claim 1, wherein said first and second semiconductor devices are IGCTs (Integrated Gate Commutated Thyristor).

8. The arrangement according to claim 1, wherein said first semiconductor device has said first, high level of ≥3 kV, ≥5 kV, ≥10 kV or 5 kV-30 kV.

9. The arrangement according to claim 1, wherein said valve has a first rectifying member with a voltage blocking capacity rating of a third, high level connected in anti-parallel with said first semiconductor device and a plurality of second rectifying members with a voltage blocking capacity rating of a fourth, lower level connected in series and in anti-parallel with said series connection of second semiconductor devices.

10. The arrangement according to claim 9, wherein said valve comprises a third semiconductor device of turn-off type connected in series with said first rectifying member and in parallel with said first semiconductor device.

11. The arrangement according to claim 10, wherein said third semiconductor device is a MOS transistor.

12. The arrangement according to claim 9, wherein the number of said second rectifying members is the same as the number of said second semiconductor devices, and that one said second rectifying member is connected in anti-parallel with each said second semiconductor device.

13. The arrangement according to 9, wherein said rectifying members are rectifying diodes.

14. A Voltage Source Converter (VSC) for converting direct voltage into alternating voltage and conversely, which has at least one phase leg configured to be connected to opposite poles on a direct voltage side of the converter and comprising:
a series connection of at least two current valves, each of said valves comprising one first semiconductor device of turn-off type with a voltage blocking capacity rating of a first, high level and series-connected second semiconductor devices of turn-off type with a voltage blocking capacity rating of a second, lower level, the first semiconductor device being connected in parallel with the series-connected second semiconductor devices, wherein a mid point of said series connection of valves forms a phase output which is configured to be connected to an alternating voltage side of the converter, the converter further comprising a control arrangement configured to control the semiconductor devices of said valves to generate a train of pulses with determined amplitudes according to a Pulse Width Modulation (PWM) pattern on said phase output, where the control arrangement and said control arrangement is configured to switch said valve into a conducting state starting from a forward biased blocking state of the valve by controlling said second semiconductor devices to be turned on and then said first semiconductor device to be turned on with a delay sufficient for the voltage across said valve to fall to a fraction of less than 10% of the voltage across the valve in said forward biased blocking state of the valve and at the end of the conducting state to turn off said first semiconductor device in advance of turning said second semiconductor devices off, where said second semiconductor devices are turned off by said control arrangement after a majority of recombinations of charge carriers in said first semiconductor device has taken place.

15. The converter according to claim 14, wherein each said valve comprises a series connection of a plurality of units having on one hand one first semiconductor device and on the other hand a series connection of second semiconductor devices connected in parallel therewith, and that said control arrangement is configured to control all said first semiconductor devices of the valve substantially simultaneously and all second semiconductor devices of the valve substantially simultaneously.

16. The converter according to claim 15, wherein said number of first semiconductor devices in said valve adapted to be controlled simultaneously is ≥3, ≥5, ≥10, ≥20, 20-130 or 40-80.

17. The converter according to claim 14, wherein said control arrangement is configured, when said valve is in a state in which the current flows through the rectifying members thereof, to control said third semiconductor device to turn off prior to a main commutation of the current to flow through a valve on the other side of said mid point than said valve for having the current commutated into the second rectifying members before such a main commutation.

18. A plant for transmitting electric power comprising a direct voltage network and at least one alternating voltage network connected thereto through a station, said station being adapted to perform transmitting of electric power between the direct voltage network and the alternating voltage network and comprising at least one Voltage Source Converter adapted to convert direct voltage into alternating voltage and conversely, wherein said station of the plant comprises a Voltage Source Converter according to claim 14.

19. A method for controlling a Voltage Source Converter (VSC) comprising a series connection of at least two current valves, said valves comprising at least one semiconductor device of turn-off type and one rectifying member connected in anti-parallel therewith, wherein the method is carried out for a converter in which each said valve comprises one first semiconductor device of turn-off type with a voltage blocking capacity rating of a first, high level and series-connected second semiconductor devices of turn-off type with a voltage blocking capacity rating of a second, lower level, the first semiconductor device being connected in parallel with the series-connected second semiconductor devices, that said valve is switched into a conducting state starting from a forward biased blocking state of the valve by controlling said second semiconductor devices to be turned on and then said first semiconductor device to be turned on with a delay sufficient for the voltage across said valve to fall to a fraction of less than 10% of the voltage across the valve in said forward biased blocking state of the valve, and that at the end of the conducting state said first semiconductor device is turned off in advance of turning said second semiconductor devices off, where said second semiconductor devices are turned off after a majority of recombinations of charge carriers in said first semiconductor device has taken place.

20. The method according to claim 19, wherein said first semiconductor device is turned on with said delay being less than 10% of an average duration of a conducting state of said valve.

21. The method according to claim 19, wherein said first semiconductor device is turned off sufficiently in advance with respect to the turning off of the second semiconductor devices for reducing the current through said first semiconductor device to be less than 10% of the current therethrough in the conducting state of said valve.

22. The method according to claim 19, wherein it is carried out for a converter in which each said valve comprises a series connection of a plurality of units having on one hand one first semiconductor device and on the other hand a series connection of second semiconductor devices connected in parallel therewith, and that all said first semiconductor devices are controlled substantially simultaneously and all second semiconductor devices of the valve are controlled substantially simultaneously.

\* \* \* \* \*